United States Patent [19]

Lim et al.

[11] Patent Number: 5,194,972
[45] Date of Patent: * Mar. 16, 1993

[54] MICROWAVE PHASE MODULATION WITH LIQUID CRYSTALS

[75] Inventors: Khoon C. Lim, Agoura; J. David Margerum, Woodland Hills; Anna M. Lackner, Los Angeles; Leroy J. Miller, Canoga Park, all of Calif.

[73] Assignee: Hughes Aircraft Company, Los Angeles, Calif.

[ * ] Notice: The portion of the term of this patent subsequent to Feb. 2, 2010 has been disclaimed.

[21] Appl. No.: 837,571

[22] Filed: Feb. 18, 1992

Related U.S. Application Data

[63] Continuation of Ser. No. 573,504, Aug. 24, 1990, abandoned.

[51] Int. Cl.⁵ .............................................. G02F 1/13
[52] U.S. Cl. ........................................ 359/46; 359/36; 359/94; 333/157; 343/771
[58] Field of Search ................ 333/157; 350/334, 335, 350/341, 347 V, 373, 350 R; 359/36, 46, 53, 78, 83, 84, 94; 343/768, 771, 777

[56] References Cited

U.S. PATENT DOCUMENTS

| | | | |
|---|---|---|---|
| 2,532,157 | 11/1950 | Evans | 333/157 |
| 3,631,501 | 12/1971 | Buscher | 333/157 |
| 3,701,058 | 10/1972 | Smith | 333/157 |
| 3,805,197 | 4/1974 | Buscher | 333/157 |
| 4,435,047 | 3/1984 | Fergason | 350/334 |
| 4,613,869 | 9/1986 | Ajioka et al. | 343/768 |
| 4,688,900 | 8/1987 | Doane et al. | 350/347 V |

FOREIGN PATENT DOCUMENTS

| | | | |
|---|---|---|---|
| 1204281 | 11/1965 | Fed. Rep. of Germany | 333/157 |
| 3727945 | 2/1988 | Fed. Rep. of Germany | |
| 60-214105 | 10/1985 | Japan | 333/157 |
| 1352561 | 11/1987 | U.S.S.R. | 333/157 |
| 1356048 | 11/1987 | U.S.S.R. | 333/157 |

OTHER PUBLICATIONS

"Nonlinear Microwave Susceptibility Measurement of an Artificial Kerr Medium", Bradley Bobbs et al., Appl. Phys. Lett., vol. 52, No. 1, Jan. 4, 1988, pp. 4–6.
P. Debye, "Polar Molecules", Chemical Catalog Co., Chapt. V (New York 1929).
"Liquid Dielectric Phase Shifters", Final Report for Contract DAAK40–76–C–C–0516, S. Kaye et al., 1977.
"Electrically Controllable Liquid Artificial Dielectric Media", H. T. Busher, 1979 IEEE.
"Electrooptical Characteristics of Dipole Suspensions", A. M. Marks, Applied Optics, Jul. 1969, vol. 8, No. 7, pp. 1397–1412.
"Suspended Particle Display with Improved Properties", R. L. Saxe et al., 1982 IEEE, 1982 International Display Research Conference.

*Primary Examiner*—Rolf Hille
*Assistant Examiner*—Minhloan Tran
*Attorney, Agent, or Firm*—E. E. Leitereg; V. D. Duraiswamy; W. K. Denson-Low

[57] ABSTRACT

A liquid crystal is used as the phase modulating medium in a microwave phase modulating cell (20). Applied electric and/or magnetic fields transverse to the direction of wave propagation create a birefringence that changes the velocity of wave propagation and the index of refraction of the medium. The phase modulating cell (20) is used singly or in arrays to direct microwave beams.

25 Claims, 6 Drawing Sheets

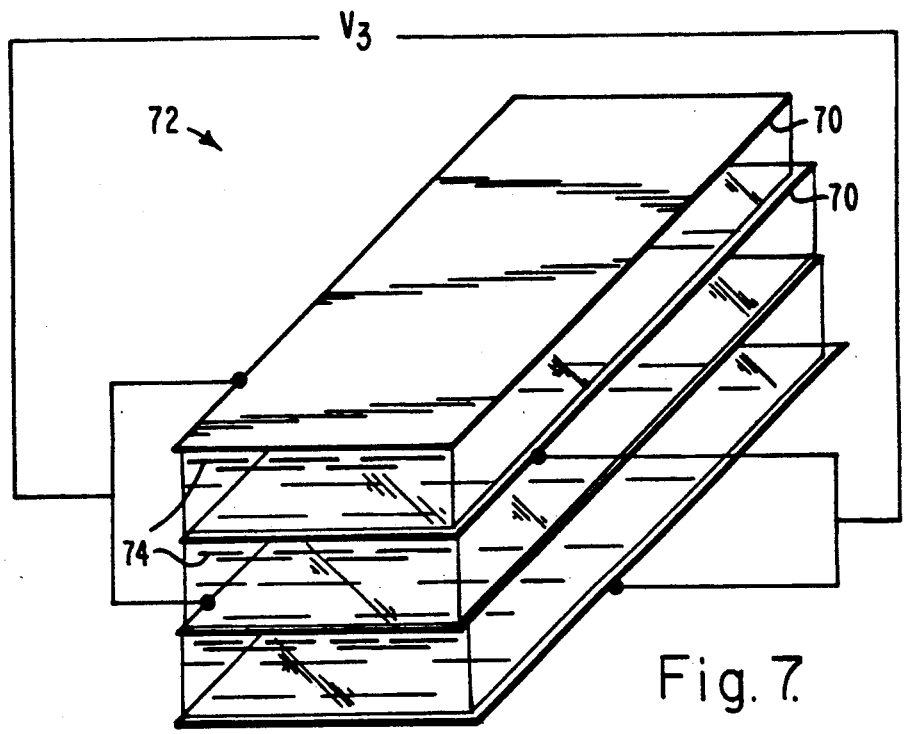
Fig. 7.
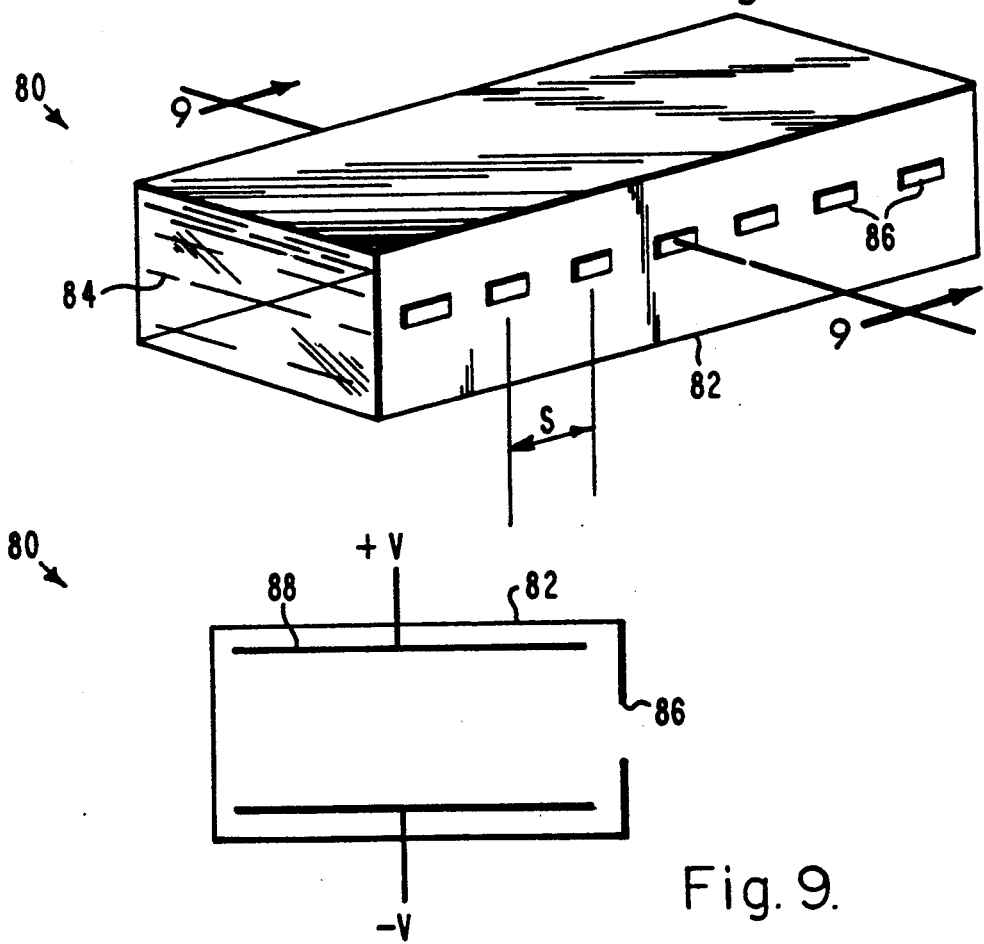
Fig. 8.
Fig. 9.

MICROWAVE PHASE MODULATION WITH LIQUID CRYSTALS

This is a continuation of application Ser. No. 07/573,504, filed Aug. 24, 1990 now abandoned.

BACKGROUND OF THE INVENTION

This invention relates to microwave (including millimeter wave) devices, and, more particularly, to microwave phase modulation with liquid crystals.

The index of refraction of many media is fixed and essentially constant, but there are "birefringent" media where the index of refraction of the material varies with relative orientation of a polarized wave and the medium. The birefringence of a uniaxial crystal is manifested by double angular displacements of a wave that passes through the medium. For example, in many viewing angles calcite crystals are birefringent to visible light, so that two differently positioned images are often seen when an object is viewed through a calcite crystal.

The index of refraction of some birefringent materials and of Kerr-effect isotropic materials can be controllably varied directionally by the application of a magnetic or electrical field to the medium. For example, liquid crystals are known to be birefringent for visible light, and variable under the application of an electric field. This property has been used in liquid crystal light valves to make color projection displays.

A liquid crystal is a state of matter intermediate between that of a liquid and a solid crystal, and having some properties of each. The liquid crystals are a liquid in the sense that they are a condensed phase that is flowable. They exhibit quasi-crystalline behavior in that their molecules may exist in an oriented arrangement wherein many molecules are aligned with respect to each other.

Liquid crystals have been known for more than 100 years, with particularly extensive development of new materials and devices in the last 30 years. The following references provide a general background to the structures, classifications, nomenclature, and applications of liquid crystals: "Liquid Crystals", Proc. of Inter. Liquid Crystal Conf., Bangalore, India, Ed. by S. Chandrasekhar (Bangalore Book Printers, 1973); G. H. Brown et al., "A Review of the Structure and Physical Properties of Liquid Crystals, Ed. by B. J. Starkoff (The Chemical Rubber Company by CRC Press, 1971); "Liquid Crystals, The Fourth State of Matter", Ed. by F. D. Saeva (Marcel Decker, 1979); G. W. Gray, "Molecular Structure and the Properties of Liquid Crystals" (Academic Press, 1962); "Liquid Crystal Devices", Ed. T. Kallard (Optosonic Press, 1973); "Liquid Crystals and Their Applications", Ed. T. Kallard (Optosonic Press, 1970); and J. D. Margerum and L. J. Miller, "Electro-Optical Applications of Liquid Crystals", J. Colloid and Interface Science 58, pages 559–580 (1977).

Birefringent materials have been known and used for controlling visible light, and there are many potential applications for such materials in other portions of the electromagnetic spectrum such as the microwave range. Although viable birefringent and Kerr-effect materials are known for use in the visible-light frequency range, until recent years there have been known few if any practical Kerr-effect materials nor any birefringent materials for microwave radiation applications. The most promising reported Kerr-effect materials for use in the microwave range are suspensions of highly asymmetric metallic particles in organic liquids. It is, however, difficult to maintain a stable suspension of the high concentration of particles required for practical applications. Mechanical agitation (by circulation of the fluid) has been used in the microwave studies of these Kerr media, but continuous mechanical agitation is not practical for many device applications. The birefringence of these suspensions, when achieved, is typically about 0.08 or less.

Although such media having controllable indices of refraction to microwaves are known, there is a need for much more stable media with increased birefringence and convenience of use to control beams of microwave energy, in applications such as scanning array antennas. The greater the birefringence, the more readily a device can be made to achieve a preselected degree of beam control. Moreover, the cost of the medium and the control mechanism for many existing microwave modulators, such as ferrite phase modulators, is so high that they cannot be used in applications that require a large number of arrays, or must be low cost to be commercially feasible. The present invention fulfills the need for an improved microwave-birefringent material which can be controlled with applied electric and magnetic fields, and further provides related advantages.

SUMMARY OF THE INVENTION

The present invention provides a birefringent medium that is relatively stable against changes in the medium during use, such as phase separation between the particles and the suspending fluid. The medium is useful in a phase modulating cell, which in turn is useful in a phase modulating array. The medium of the invention has a high birefringence that can be controlled with applied fields, is inexpensive to fabricate, can be operated with low power consumption, and does not require complex control mechanisms and software for operation.

In accordance with the invention, a microwave phase modulating cell comprises a microwave wave guide; a phase modulating medium disposed within the wave guide, the phase modulating medium comprising a liquid crystal; and means for controllably aligning the average direction of the liquid crystal molecules in the phase modulating medium.

A key to the invention is the discovery that a substantially homogeneous phase modulating medium, a liquid crystal, exhibits a large microwave birefringence which can be utilized by orientation of the liquid crystal with applied electric and magnetic fields. The visible light birefringence of liquid crystals, which is associated with their anisotropic molecular polarizabilities, and related to electronic band transitions in the ultraviolet region (above about $10^{15}$ Hz), is well known. This birefringence extends into the infrared region, where it is also affected by anisotropy of vibrational molecular motions. However, neither of these effects has been considered significant in the much lower frequencies of the microwave region, defined herein to extend from about 1 GHz (gigahertz, or $10^9$ Hz), with a wavelength of about 30 centimeters, to about 100 GHz, with a wavelength of about 3 millimeters, the range conventionally including both the microwave and the millimeter wave portions of the electromagnetic spectrum. The appearance of substantial microwave birefringence in liquid crystals was unexpected, and has not previously been used for phase shift modulation.

The present invention therefore represents an important advance in the art of microwave devices. Microwave range liquid crystal phase modulators that operate at low power, are compact in size, have low fabrication cost, and can be assembled in large arrays may be fabricated. The liquid crystals are macroscopically homogeneous, and do not exhibit the flocculation and/or gravity-driven phase separation observed in those microwave phase modulators which are a mixture of particles and a carrier phase. Other features and advantages of the invention will be apparent from the following more detailed description of the preferred embodiment, taken in conjunction with the accompanying drawings, which illustrate, by way of example, the principles of the invention.

BRIEF DESCRIPTION OF THE DRAWINGS

FIG. 7 is a perspective view of a layered liquid crystal waveguide phase modulator;

FIG. 8 is a perspective view of a liquid crystal tunable slot array antenna;

FIG. 9 is a sectional view of the slot array antenna of FIG. 8, taken along lines 9—9;

DETAILED DESCRIPTION OF THE INVENTION

The present invention is based upon the use of thermotropic types of liquid crystals (including nematic, cholesteric or chiral, and smectic phases) which can be aligned by applied electrical and/or magnetic fields, and which have birefringent properties in the microwave (including millimeter wave) electromagnetic range. Microwave modulators and devices can be made with a wide range of such liquid crystal structures, which have surprisingly high birefringent values along with acceptably low dielectric loss values in the microwave region. The liquid crystals are stable fluids, and do not require the constant agitation of the previously known metal particle/organic liquid microwave birefringent materials.

The most favorable of such liquid crystal structures for achieving microwave birefringence are highly conjugated, rod-like, type molecular structures, such as for example structures containing biphenyl, terphenyl, phenylprimidine, biphenylpyrimidine, tolane, and diphenyldiacetylene groups. Other types of liquid crystal structures, including Schiff bases, azoxybenzenes, and aromatic esters also have substantial birefringence in the microwave region.

As used herein, the term "microwave" includes electromagnetic waves having wavelengths of from about 1 GHz to about 100 GHz. Thus, the term "microwave" is intended to include the portions of the electromagnetic spectrum that are otherwise sometimes described by the terms microwave and millimeter wave.

Figure 1:
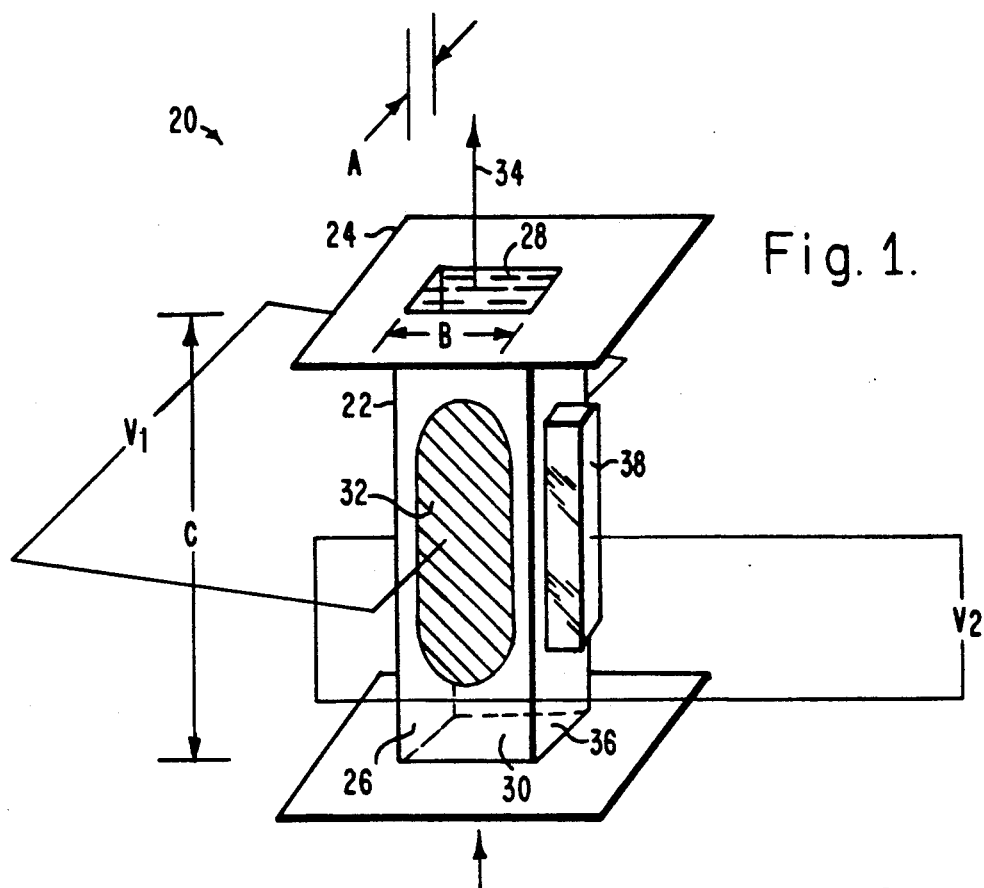
FIG. 1 is a perspective view of a phase modulating cell.

A basic phase modulating cell 20 is depicted in FIG. 1. The cell 20 includes a microwave wave guide 22, which is a hollow metal tube, usually rectangular in cross section, that is dimensioned for the propagation of microwaves therein. By way of illustration and not limitation, dimensions are indicated on the drawing for a cell 20 to be used in conjunction with microwaves having a frequency of 30 GHz in the $K_a$ radar band. For such a cell, the height A is about 0.35 centimeters, the width B is about 0.7 centimeters, and the length C is about 10 centimeters. The wave guide 22 normally has a mounting flange 24 on each end thereof. An interior cavity 26 of the wave guide 22 is filled with a liquid crystal material. The ends of the cavity 26 are closed with thin plastic windows 28 about 15 micrometers thick.

Apertures are cut into two opposing faces 30 of the rectangular wave guide 22, and opposing electrodes 32 are mounted therein as the means to controllably align the liquid crystal molecules. The electrodes 32 are connected to a voltage source $V_1$ so that, when the voltage $V_1$ is applied there is an electric field whose vector extends between the electrodes and transverse to a wave path 34.

Because the dimensions of the wave guide 22 are too large for surface alignment effects on the bulk liquid crystal, the molecules of the liquid crystal are initially locally aligned in randomly oriented domains. When the voltage $V_1$ is applied across the electrodes 32, the molecules of a positive dielectric anisotropy liquid crystal align parallel to the field vector and thence perpendicular to the wave path 34. This condition of alignment may be viewed as a first aligned state, to be distinguished from the randomly oriented state.

When the voltage is discontinued, the liquid crystal tends to return to a randomly oriented state, but that return is typically very slow and uncontrolled in the nematic phase because of the weak surface alignment forces exerted on the liquid crystal in a typical wave guide. To provide a more rapid, controllable change to a well-defined second state, a second means for aligning the molecules of the liquid crystal is provided. The second means could be another set of electrodes similar to the electrodes 32, except oriented with the field vector between the electrodes at a different angle to the wave path 34.

Alternatively in a preferred approach, magnet pole pieces are mounted on opposing sides of the cavity 26 such that the line between the pole pieces is at some other angle to the wave path 34. These magnets can be permanent magnets, in which case the orthogonal electric field, when applied, must have sufficient strength to overcome the magnetic field. Alternatively and as illustrated in FIG. 1, apertures are cut into the other two opposing faces 36 and a pair of opposing electromagnet pole pieces 38 mounted in the apertures. The windings of the pole pieces 38 are connected to a second voltage source $V_2$. As yet a further alternative, two sets of orthogonal electrodes could be used, although control of the orientation of the liquid crystal using two separate types of forces may reduce the field between the electrodes set at right angles to each other.

Returning to the preferred approach illustrated in FIG. 1, when the voltage $V_2$ is applied to the windings of the pole pieces 38, in the absence of the voltage $V_1$ applied to the electrodes 32, the molecules of the positive diamagnetic anisotropy liquid crystal tend to align parallel to the direction extending between the pole pieces 38, and perpendicular to the wave path 34. This is the second aligned state of the liquid crystal in the phase modulating cell 20.

Thus, with nematic liquid crystals of positive dielectric and diamagnetic anisotropy, there are three limiting alignment conditions readily achieved with an apparatus that has both the opposing electrodes 32 and the opposing pole pieces 38. There is a random state, where there is no alignment. There is a first aligned state, with the molecules of the liquid crystal aligned parallel to the vector between the electrodes 32, and there is a second aligned state, with the molecules of the liquid crystal aligned parallel to the vector between the pole pieces 38. Since there is a relatively small restoring force tending to drive the liquid crystal back to the random state, the degree of alignment in either the first or the second state can be controlled by the value of the applied voltage $V_1$ or $V_2$. The voltages $V_1$ and $V_2$ can be applied simultaneously, to achieve a degree of alignment in some other direction in the plane perpendicular to the direction of wave propagation 34.

Thus, in accordance with the invention, a method for modulating the phase of a microwave comprises the steps of providing a microwave phase modulating cell comprising a phase modulating medium, the phase modulating medium comprising a liquid crystal, and means for controlling the alignment of the liquid crystal; directing a beam of microwave energy through the cell in a microwave propagation direction; and operating the means for controllably aligning the liquid crystal, thereby changing the microwave index of refraction of the phase modulating medium.

A polarized microwave beam having an electric field vector P is directed through the wave guide 22 parallel to its axis along the wave path 34, and through the windows 28. The index of refraction of the birefringent medium within the wave guide 22, relative to the microwave beam, is controlled by adjusting the voltages $V_1$ and $V_2$. In one instance, voltage $V_2$ to the electromagnets 38 is maintained zero and the voltage $V_1$ to the electrodes 32 is increased to align the molecules of the positive dielectric anisotropy liquid crystal perpendicular to the faces 30. After a period of time, $V_1$ is reduced to zero and $V_2$ is gradually increased to align molecules of the liquid crystal perpendicular to the faces 36. The velocity of the microwave is altered as the voltages are changed, and the index of refraction of the medium within the phase modulating cell is also altered.

Several phase modulating cells like that of FIG. 1 were constructed to evaluate the approach of the invention. The liquid crystal was placed into each of the phase modulating cells. For all of these tests the microwave wave had a frequency of 30 GHz, so standard WR-28 wave guides were used. Phase shift modulations of three types were observed with these cells, specifically (a) from random liquid crystal alignment to electrical field (E-field) alignment, (b) from random alignment to magnetic field (H-field) alignment, and (c) from E-field alignment (without H-field) to orthogonal H-field alignment (without E-field). A voltage of 300 Volts at 60 Hz was applied between the electrodes 32, which were spaced 0.35 centimeters apart, and a magnetic field of 3 kilogauss was applied. A standard Mach-Zehnder microwave phase bridge such as that described in the publication "Nonlinear microwave susceptibility measurement of an artificial Kerr medium" by Bradley Bobbs et al., *Appl. Phys. Lett.*, vol. 52, no. 1, Jan. 4, 1988, at pages 4–6, was used for the measurements.

Figure 2:
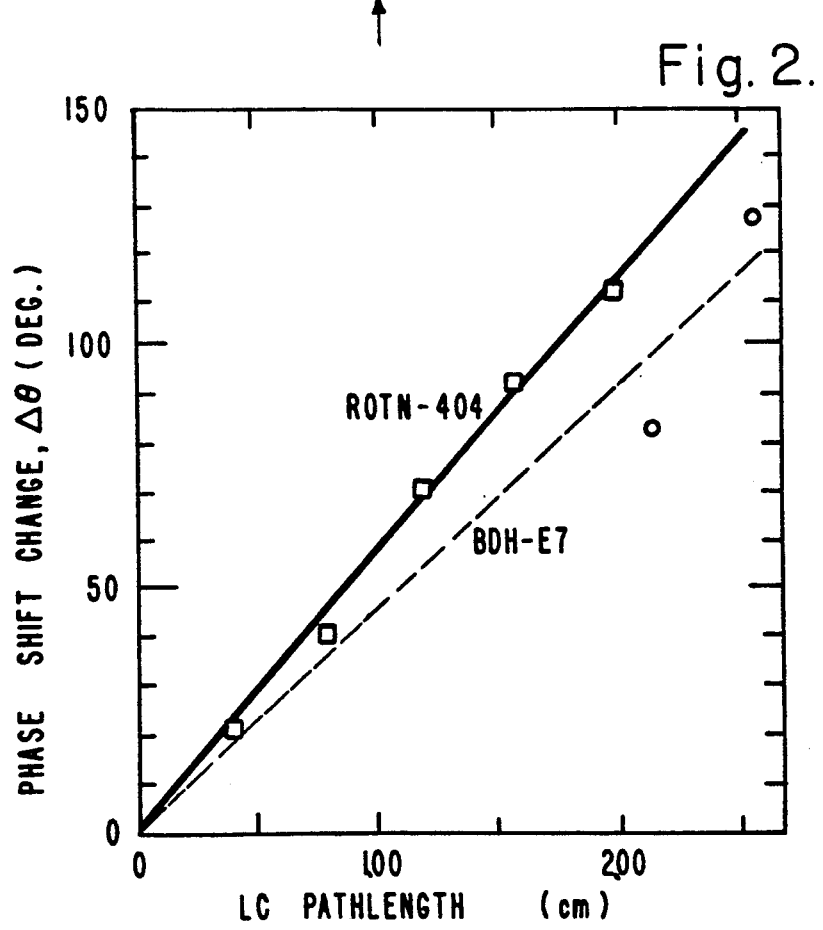
FIG. 2 is a graph of phase shift angle in switching between orthogonal electric field and magnetic field liquid crystal (LC) alignment, as a function of length of the phase modulating cell.

Fig. 2 depicts the phase shift of the microwave as a function of the path length, that is, the length of microwave travel through the liquid crystal, as the liquid crystal orientation was changed for E-field alignment to the orthogonal H-field alignment. ROTN-404 and BDH-E7 liquid crystal compositions are commerically available from Hoffman-LaRoache and BDH Chemical, Ltd., respectively. The birefringence of the liquid crystal is defined as the difference between its refractive index parallel to the director of the liquid crystal and its refractive index perpendicular to the director of the liquid crystal.

The observation of liquid crystal birefringence in the microwave region is surprising and unexpected, and has not been previously reported. Although liquid crystals exhibit birefringence in the visible spectrum, the observed birefringence decreases from the ultraviolet ($3 \times 10^{-5}$ centimeter wavelength) through the visible and into the infrared ($10^{-3}$ centimeter wavelength) regions, while the microwave region has a much longer wavelength of about 0.3 to 30 centimeters. Moreover, liquids generally exhibit strong dispersion in many of their dielectric, absorption loss, and relaxation properties in going from the visible to the microwave region, as described by P. Debye, "Polar Molecules", Chemical Catalog Co., Chapter V (New York, 1929). Additionally, the dielectric anisotropy of liquid crystals is known to exhibit somewhat unpredictable behavior in the 1 kHz to 100 MHz range, and may decrease and remain positive, become zero, or decrease and become negative in that range. There is no firm basis for predicitng the dielectric and birefringent behavior of liquid crystals in the 1-100 GHz microwave range, which is much lower than the optical frequency. Possibly for this reason, it is believed that there has been no prior utilization of liquid crystals for electromagnetic microwave modulation.

Figure 3:
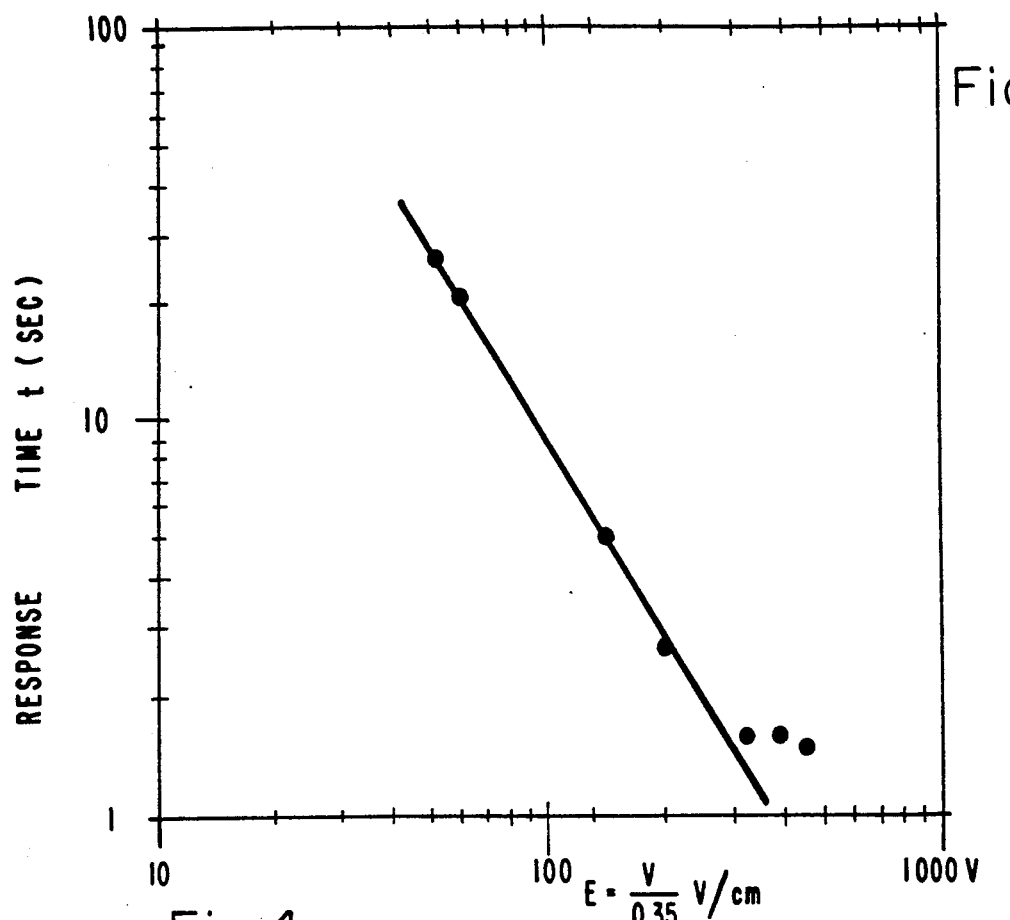
FIG. 3 is a graph of response time as a function of applied electric field strength.

The response time to achieve the first aligned state was measured for the BDH-E7 material, as a function of the voltage applied to the electrodes 32, and the results are shown in FIG. 3. The shortest response time in the cell of FIG. 1 was about 1.5 seconds for applied voltages of about 300 volts (850 volts per centimeter), which is a relatively low field strength compared to those used in optical liquid crystal devices, typically more than 10,000 volts per centimeter.

A variation of the cell of FIG. 1 was constructed in which the E-field and the H-field were applied (consecutively) in the same direction, both parallel to the polarization direction of the 30 GHz microwave signal. The cell was filled with NP5, a nematic liquid crystal that has a negative dielectric anisotropy and a positive diamagnetic anisotropy, which is commercially available from E. Merck. The phase shift difference between these two fields indicated an effective birefringence of 0.09 in this mode of operation. The H-field aligned the NP5 liquid crystal parallel to the microwave electromagnetic polarization, while the E-field would be expected to align it in planes perpendicular to the microwave polarization.

Figure 4:
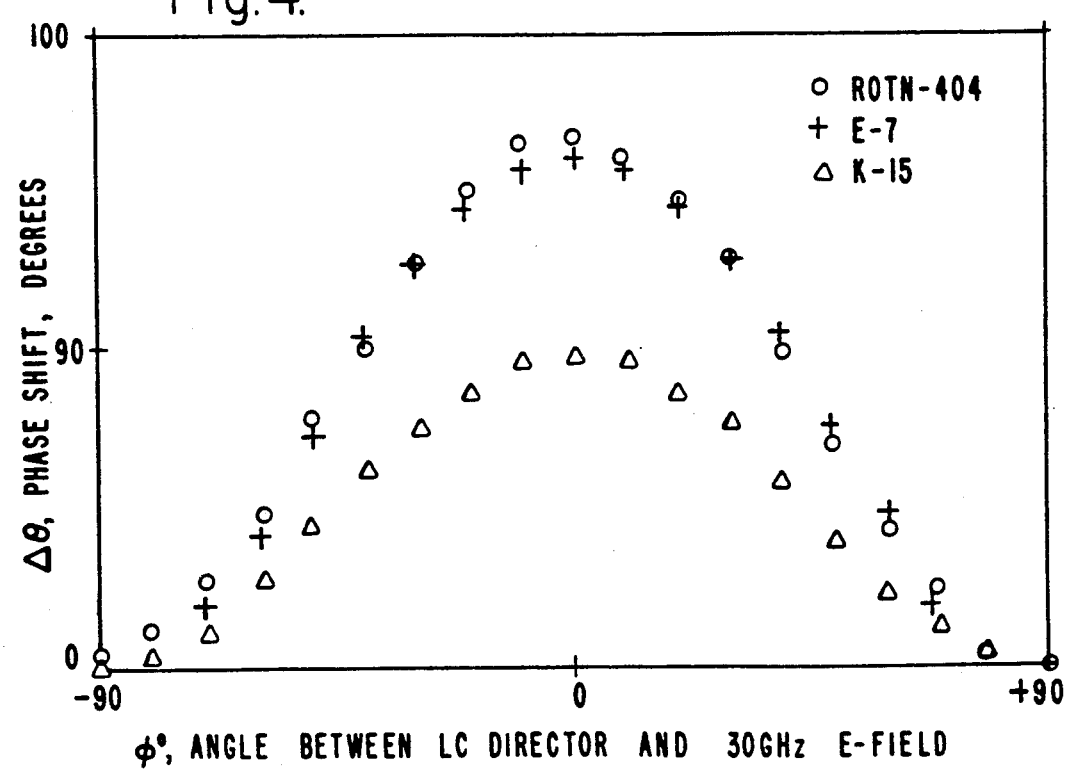
FIG. 4 is a graph of the change in phase shift of three different liquid crystals as an external magnetic field used to align the liquid crystal director is rotated +/−90 degrees with respect to the 30 GHz millimeter wave E-field polarization direction.

In another 30 GHz waveguide test cell, the effect of the angle between the direction of the field used to align the liquid crystal and the direction of the microwave electromagnetic field polarization P was found to strongly affect the phase shift $\Delta\theta$. The results are shown in FIG. 4 for ambient temperature meausrements of three different liquid crystals over a 2.5 centimeter path length, aligned just by an external magnetic field slowly rotated in position around the axis of the waveguide cell containing the liquid crystal. The microwave birefringence $\Delta n$ for each liquid crystal was calculated from the peak $\Delta\theta$, using the expression $$\Delta\theta = 2\pi \Delta n d / \lambda,$$

where d is the path length and $\lambda$ is the microwave wavelength, here 1 centimeter.

Table I presents the calculated microwave birefringences at 30 GHz for the three liquid crystals of FIG. 4, and for several other liquid crystals measured in the same manner. Table I also

TABLE I

| Liquid Crystal | Source | Structure Type | $\Delta n$ 30GHz | $\Delta n$ 589 nm | ratio of $\Delta n$ |
|---|---|---|---|---|---|
| ROTN-404 | Hoffman LaRoche | cyanobiphenyls, cyanophenyl-pyrimidines | 0.166 | 0.268 | 0.62 |
| Tolane I/II | Atomeric | Alkyl-alkoxytolanes | 0.163 | 0.226 | 0.72 |
| E7 | BDH | cyanobiphenyls, cyanoterphenyls | 0.160 | 0.225 | 0.71 |
| NP5 | E. Merck | azoxybenzene | 0.147 | 0.290 | 0.51 |
| 1085 | E. Merck | aromatic esters (crossover nematic) | 0.114 | 0.170 | 0.67 |
| MBBA | Hughes | Schiff-base | 0.106 | 0.227 | 0.47 |
| K15 | BDH | cyanobiphenyl | 0.098 | 0.184 | 0.53 |
| 16963 | BDH | chiral nematic | 0.091 | 0.198 | 0.46 |
| NP-55 | Hughes | esters (cyanophenyl benzoates) | 0.082 | 0.150 | 0.55 | indicates the types of molecular structures present in each of these liquid crystals, most of which are multi-component mixtures, and for comparison shows their optical birefringence at the visible sodium-D line, 589 nanometers. In most cases, the type of liquid crystal is known and indicated in the table, and this information is sufficient to classify the behavior of the liquid crystal type. The specific compositions are in many cases proprietary to the manufacturers but in some cases are known. BDH E7 contains 51 percent 4-cyano-4'-pentylbiphenyl, 25 percent 4-cyano-4-heptylbiphenyl, 16 percent 4-cyano-4'-octylbiphenyl, and 8 percent 4-cyano-4''-pentyl-p-terphenyl. Hughes NP55 contains 18.8 percent 4-cyanophenyl 4-butylbenzoate, 43.8 percent 4-cyanophenyl 4-heptylbenzoate, 20.8 percent 4-butyl-phenyl 4-methylbenzoate, and 16.7 percent 4-butylphenyl 4-(4-butylbenzoyloxy)benzoate.

It is also known that MBBA is p-methoxybenzylidene p-butylaniline, and that NP5 has a negative dielectric anisotropy.

As shown in Table I, the liquid crystal structures have surprisingly high birefringent values at 30 GHz, up to about 71 percent of their birefingence in the visible range at 589 nanometers. From these comparisons, it has been determined that the most favorable such liquid crystal structures to attain large microwave birefringence are highly conjugated, rod-like, type molecular structures, such as structures containing biphenyl, terphenyl, phenylpyrimidine, biphenylpyrimidine, tolane, and diphenyldiacetylene groups. Many other types of liquid crystal structures, including Schiff bases, azoxybenzenes, and esters also have substantial birefringence in the microwave region.

Table I includes many different types of liquid crystal structural components, and also various classes of liquid crystals including nematic (ROTN-404, Tolane I/II, E7, NP5, MBBA, K15, and NP-55), a crossover nematic (1085, which at room temperature has a positive dielectric anisotropy at applied voltage frequencies below 3.5 kHz and a negative dielectric anisotropy above 3.5 kHz), and a chiral nematic type of cholesteric (16963). All of the liquid crystal materials in Table I have positive diamagnetic anisotropy, and tend to align in the direction of the applied magnetic field. In the usual frequency range of applied E-fields (DC to 100 kHz), most of these liquid crystals have positive dielectric anisotropy, except for NP5 which has a negative dielectric anisotropy in this range and for the crossover liquid crystal 1085.

Various types of liquid crystals can be used to achieve other design features. For example, switching between two aligned states can be achieved with a single pair of opposed electrodes. That is, no second pair of electrodes or pole pieces is required. Some liquid crystals such as 1085 exhibit a crossover in dielectric anisotropy with frequency of the applied field. Crossover nematic liquid crystals have a positive dielectric anisotropy in low frequency applied fields, and negative dielectric anisotropy in high frequency applied fields. Application of a low frequency voltage $V_1$ to the electrodes 32 causes the molecules of the liquid crystal to align parallel to the applied field vector, while application of a high frequency voltage $V_1$ causes the molecules to align perpendicular to the field vector between the electrodes 32 and thence perpendicular to the microwave electric field vector P. A number of such crossover liquid crystal mixtures are known, including ZLI-1085 (Table I), ZLI-2976, ROTN 3421, and HRL 2PN6. The ZLI-1085 and ZLI-2976 are commercially available from E. Merck. The ROTN-3421 is commercially available from Hoffman-LaRoche. The HRL-2PN6 is a 1:1 mixture of the two liquid crystals EK-11650 and EK-15320 available from Eastman Kodak. In each of these cases, the room temperature dielectric anisotropy is positive for low frequency electrical fields below their respective crossover frequencies applied to the electrodes 32. The room temperature dielectric anisotropy is negative at frequencies above their respective crossover frequencies. For example, the orientation of ZLI-1085 from Table I can be switched from parallel to perpendicular to the microwave field vector P by switching the frequency of the voltage applied on electrodes 32 from 100

Hz to 10 kHz, providing a fast response in switching orientation.

The microwave birefringent phase shift of liquid crystals was also measured over a range of frequencies from 15 to 75 GHz, using a HP8510 vector network analyzer, with external H-field alignment of the liquid crystals. The results are shown in Table II for the liquid crystals BDH-E 7 and ROTN-404:

TABLE II

| Frequency GHz | Wavelength (centimeters) | BDH-E7 (Δθ/cm) | Δn | ROTN-404 (Δθ/cm) | Δn |
|---|---|---|---|---|---|
| 15 | 2.0 | 19 | 0.11 | — | — |
| 30 | 1.0 | 40 | 0.11 | 51 | 0.14 |
| 60 | 0.5 | 100 | 0.14 | 120 | 0.17 |
| 75 | 0.4 | 120 | 0.13 | 155 | 0.17 |

In Table II, Δθ/cm is the phase shift change per centimeter of path length of liquid crystal in switching an external magnetic field of 3 kilogauss from perpendicular to parallel with respect to the microwave polarization direction. The value of Δ n is an approximate calculated value. Each of these liquid crystals shows only slightly different values of Δn over a wide range of microwave frequencies. In the same apparatus values of the microwave absorption loss of these liquid crystals were measured and estimated to be no more than about 0.25 to 2 db/cm (decibels per centimeter).

The relaxation time of a bulk liquid crystal from a field-aligned state back to its equilibrium state is very slow in the absence of restoring forces such as another field, agitation, flow, or some appreciable surface alignment effects. In a 30 GHz as shown in FIG. 1 filled with a bulk nematic liquid crystal at ambient temperature, the liquid crystal may require more than 10 hours to relax from an aligned state to a random state. The relaxation time may be greatly shortened by including additional surfaces which are in contact with the liquid crystal and provide effective realignment forces. Such surfaces can be obtained by the addition of inert bulk materials such as glass or plastic beads or powders, organic or inorganic fibers, and the like to the liquid crystal. Other techniques include the use of porous media such as porous glass or plastic, cloth, felt or the like to contain the liquid crystal within the waveguide, the use of multiple planar surfaces such as parallel conductive electrodes or thin layers of glass or plastic within the waveguide to contain the liquid crystal, or the use of liquid crystals within a microencapsulated system such as microencapsulated powders, encapsulated droplets in a polymer, or a polymer dispersed liquid crystal. However, the use of these surface techniques to speed up the relaxation time may also reduce the effectiveness of the microwave modulation by decreasing the percentage of liquid crystal in a given volume, by aligning some of the liquid crystal in the same direction as the applied field, or by creating surface forces that are too strong to be overcome with the applied fields available.

Two of these techniques were evaluated for use in microwave birefringent devices. In one, glass beads about 1.1 millimeter in diameter were added to the interior of the waveguide of the device of FIG. 1, and the liquid crystal was added to fill the remaining space.

In the other approach, E7 polymer was incorporated into a polymer dispersed liquid crystal (PDLC) prepared by ultraviolet curing of a solution of 55 percent BDH-E7 in Norland-NOA65 optical cement to form a solid PDLC block 2.2 centimeters long and of cross sectional size to fit the 30 GHz waveguide. (Other techniques for preparing PDLCs are described in U.S. Pat. No. 4,688,900 and U.S. Pat. No. 4,435,047, whose disclosures are incorporated by reference.) Electrodes were attached directly to the PDLC solid and it was slipped into a waveguide cell of the type shown in FIG. 1, except that the waveguide wall was cut away in the area of the electrodes.

Figure 5:
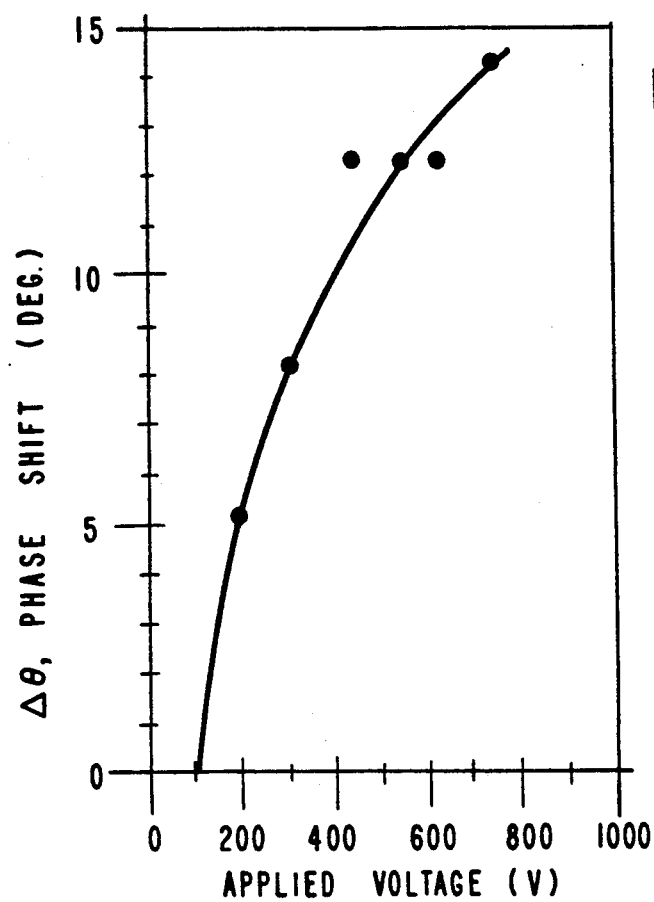
FIG. 5 is a graph of the reversible phase shift at 30 GHz in a polymer dispersed liquid crystal block caused by applying an electric field parallel to the microwave polarization direction.

Table III presents results obtained with both techniques, while FIG. 5 presents further results obtained with the PDLC material having a modulated optical length of 2.2 centimeters, for E-fields applied between electrodes spaced 0.35 centimeters apart. As shown in Table III, both techniques drastically reduce the relaxation decay time to return to the random state.

TABLE III

| Liquid crystal/ media | Phase shift (deg/cm) | on-time (2.2 kv/cm) | decay time (field rem.) |
|---|---|---|---|
| ROTN-404, bulk | 41 | 1 sec. | 3 hr.+ |
| ROTN-404 + beads | 16 | 1 sec. | 1 min. |
| E7/PDLC | 6.4 | 1 sec. | 1 sec. |

The phase shift change at 30 GHz as a function of an applied electrical field on the PDLC material is shown in FIG. 5. The E-field induced phase shift of the PDLC sample of Table III and FIG. 5 is relatively small with respect to the total volume of the E7 of 55 percent used in the solution from which the PDLC was formed, indicating that most of the liquid crystal droplets in this particular sample were to small to be aligned by the fields which were applied and that only the larger droplets responded to the field. Results from the PDLC example of Table III and FIG. 5 indicate the basic feasibility of microwave modulation with a solid PDLC material, which can be used to speed up the relaxation response time of field-aligned liquid crystals and which also provides self-containment of the liquid crystal to prevent flow or leakage effects. Improved modulation of microwaves with PDLC materials can be obtained by using polymers with low microwave loss containing a high concentration of high resistivity liquid crystal droplets of intermediate sizes, for example in the 5-50 micrometer diameter range. A PDLC solid with a low loss polymer may be made by heating a paraffin wax and a liquid crystal, as for example 50 percent by volume of BDH-E7 or BDH-E44, until a homogeneous solution is obtained and then cooling the solution so that the liquid crystal separates out within the paraffin blocks as droplets or channels.

Further improvement is gained by prealignment of the liquid crystal director in a direction perpendicular to the microwave electromagnetic polarization for the off-state of PDLCs with liquid crystals of positive dielectirc anisotropy, and by use of high applied E-fields in the 1–20 kilovolt per centimeter range by having higher applied voltages and/or multilayer electrodes within the waveguide cell to provide smaller spacings between electrodes.

Figure 6:
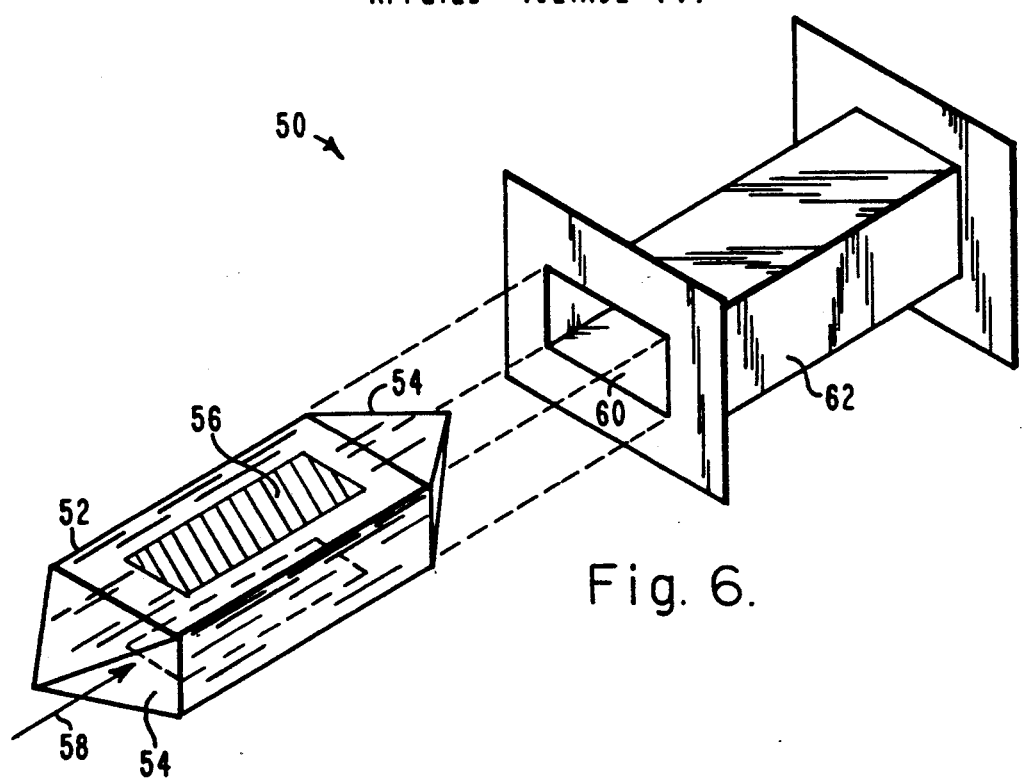
FIG. 6 is a perspective view of a cell utilizing a polymer dispersed liquid crystal phase modulating medium.

A preferred form of a cell 50 using a polymer dispersed liquid crystal microwave phase modulating medium 52 is illustrated in disassembled form in FIG. 6. The medium 52 is a free-standing piece of the polymer dispersed liquid crystal material such as that disclosed previously or in the '900 patent. The ends 54 through which the microwave waves enter and leave the medium 52 are angled. Two oppositely disposed electrode plates 56 are attached directly to the lateral sides of the medium 52, such that the electric field vector is perpendicular to the wave path 58. The electrode plates 56 function in precisely the same manner as the electrodes 32 discussed previously. Optionally, a second set of electrode plates, or magnetic pole pieces, may be provided on the other oppositely disposed lateral faces.

The entire medium 52 is assembled, and slid lengthwise into a cavity 60 of a conventional length of a microwave wave guide 62 to form the cell 50. The wave guide is available commercially and is generally as described previously. This cell 50 is then bolted into a longer waveguide or used as a component of an array, or as otherwise might be needed. The medium 52 may also be readily used without a separate wave guide, as, for example, part of a large array of separately controllable media in an antenna or other device.

As may be understood from FIGS. 3 and 5, the field strength in the liquid crystal transverse to the wave path in volts per unit length is an important factor in determining response time of the microwave phase modulating cell. Even for fairly small microwave wave guides of less than one centimeter internal size, the applied voltage must be quite high to attain a large field strength.

An approach to increasing the field strength and reducing the response time is illustrated in FIG. 7. Instead of utilizing a single pair of opposing electric field electrodes such as electrodes 32 and 56, which are located on the opposing sides of the liquid crystal medium, a plurality of pairs of opposing electrodes 70 are provided as part of a medium 72. The electrodes 70 are arranged as a series of plates in an interdigitated form, with alternating plates being oppositely charged relative to some intermediate value by connection to a voltage source $V_3$. The electrodes are preferably prepared on thin dielectric substrates such as glass or polyester films, covered with a conductive metal coating such as aluminum. The electrodes 70 are spaced closely together. Even with a modest applied voltage $V_3$ that is readily produced with an inexpensive power supply, the electric field strength of the field between the electrodes is very large due to the samll denominator in the definition of field strength, volts divided by electrode spacing.

A thin layer 74 of liquid crystal is sandwiched between each pair of electrodes 70, to complete the medium 72. The liquid crystal material can be in unconstrained liquid form, or in an encapsulated form such as a polymer dispersed liquid crystal. In the former case, the edges of the medium 72 may be sealed with a polymer adhesive to prevent loss of liquid crystal, or the entire medium 72 may be placed inside a wave guide that is in turn sealed.

The spacing of the electrodes in the apparatus of FIG. 7 depends upon the type of liquid crystal material being activated. For example, with an electrode spacing of 0.5 millimeter, a PDLC medium containing 5-10 micrometer liquid crystal droplets that is formed between the electrodes could be fully field aligned with a field of about 4-10 kilovolts per centimeter in about 10-100 milliseconds and have a relaxation decay time of about 25-250 milliseconds at room temperature. With smaller electrode spacings, such as 50 micrometers, nematic liquid crystals can be activated with relatively low voltages of about 25-50 volts, and the surface alignment forces can provide relatively fast decay times, so that both the E-field on-time and the decay time for the E-field off are in the range of about 100-500 milliseconds, depending upon the liquid crystal material. The surface alignment used for liquid crystals of postive dielectric anisotropy is a uniform surface-parallel direction, obtained for example by well known methods, such as directionally rubbing an extremely thin coating of polyvinyl alcohol on the electrode. In such a cell, the off-state and on-states have orthogonal liquid crystal alignment directions, providing the maximum phase shift available from the birefringence of the liquid crystal which is held between the electrodes by capillary attraction.

The microwave modulating materials and cells of the invention may be used either singly or in arrays, and an example of each is presented by way of example and not of limitation. FIGS. 8 and 9 illustrate a travelling wave tunable slot array antenna 80 having a wave guide 82 with a microwave birefringent liquid crystal medium 84 therein, whose effective refractive index can be varied by application of an electric or magnetic field. There are lateral openings 86 in the sides of the wave guide 82. Slot array antennas are well known. An example of a tunable antenna made with a non-birefringent ferrite material is disclosed in U.S. Pat. No. 4,613,869, which disclosure is incorporated by reference. Instead of an expensive ferrite tunable core, the less expensive birefringent liquid crystal medium 84 of the invention is used. To avoid leakage, either the openings 86 in the wave guide 82 are sealed with Mylar or similar window material, or the liquid crystal is furnished in an encapsulated form such as the polymer dispersed liquid crystal discussed previously. Electrodes 88 are placed in apertures on the sides of the wave guide 80, as shown in FIG. 9. An orthogonal magnetic field can be applied externally.

The beam direction A of a slot array antenna is governed by the relation $$l/lg - \cos A = l/s,$$

where l is the wavelength of the microwave in free space, lg is the wavelength of the microwave in the wave guide, and s is the center-to-center spacing between the slots or openings 86. The application of a voltage to the electrodes 88 causes the orientation of the molecules in the liquid crystal, which in turn interacts with the microwave to modify its wavelength in the wave guide lg. The angle A that satisfies the relation changes, thereby permitting the direction of the antenna to be changed by controlling the voltage applied to the electrodes 88.

Figure 10:
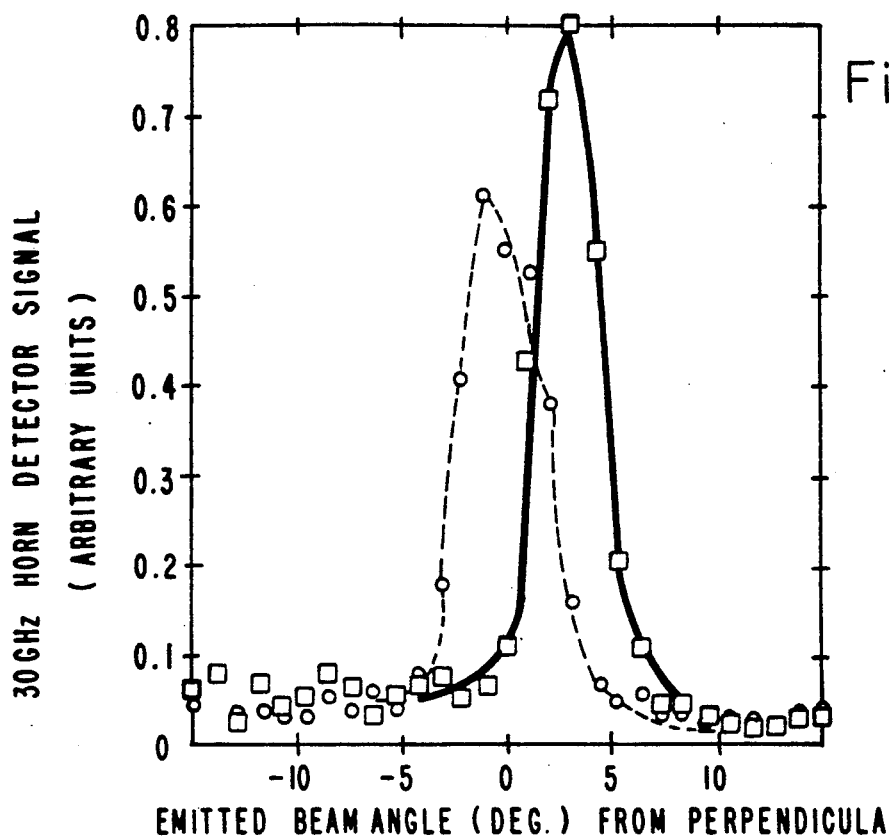
FIG. 10 is a graph showing the beam angle peaks for a 30 GHz microwave slot array antenna modulated by application of a magnetic field across the liquid crystal in the slot array.

FIG. 10 presents experimental results at 30 GHz with a tunable liquid crystal slot array microwave antenna like that illustrated in FIG. 8. The antenna was constructed of an 18 centimeter long 30 GHz waveguide having 20 slot openings with 0.7 centimeter center-to-center spacing, and was filled with BDH-E7 liquid crystal. As shown in FIG. 10, when no field was applied (data shown as circles with dashed connecting curve) a microwave beam was emitted at about −1 degree from the perpendicular to the side of the tunable array. When a 1 kiloguass transverse magnetic field was applied (data shown as squares with solid connecting curve), the array emitted a beam that was reversibly shifted to +3 degrees off perpendicular, corresponding to partial alignment of the liquid crystal. The slot array antenna was also used in a similar manner as a receiving antenna, and showed greater than 4 degrees difference between the receiving intensity peak angles. This dual functionality is an important advantage in device applications, in contrast to ferrite tunable slot array antennas which cannot be operated in both sending and receiving modes.

Figure 11:
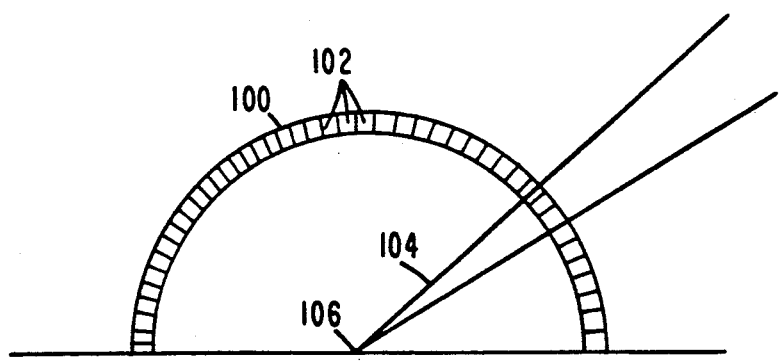
FIG. 11 is a side sectional view of a radome, without beam steering.
Figure 12:
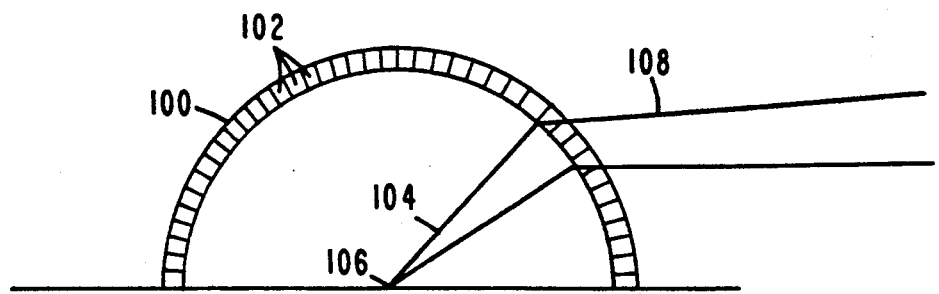
FIG. 12 is a side sectional view of a radome, with beam steering.

FIGS. 11 and 12 illustrate an array of microwave phase modulating cells that controls the sweeping of a radome 100. A plurality of individually controllable cells 102 is arranged in a locus, which may be flat, semicircular, or otherwise curved. A microwave beam 104 is directed outwardly from a source 106. When the radome cells 102 are not operating, FIG. 11, the beam passes through the radome 100 in a diffuse form. When the radome cells 102 are operating, FIG. 12, each is individually controlled to deflect the impinging portion of the beam 104 by an amount appropriate to form a deflected beam 108 that is aimed at some preselected location. If the radome 100 moves as a unit, the cells 102 may be programmed to keep the deflected beam 108 aimed at the preselected location. For example, if the radome is on a ship that rolls from side to side, the voltages applied to the cells 102 may be varied based upon a measurement of the roll and under control of a microprocessor to maintain the beam 108 aimed at the preselected location. While such an aimable radome antenna was possible with prior phase modulating systems, those systems were prohibitively expensive or did not have the stability required to ensure predictable operation.

Figure 13:
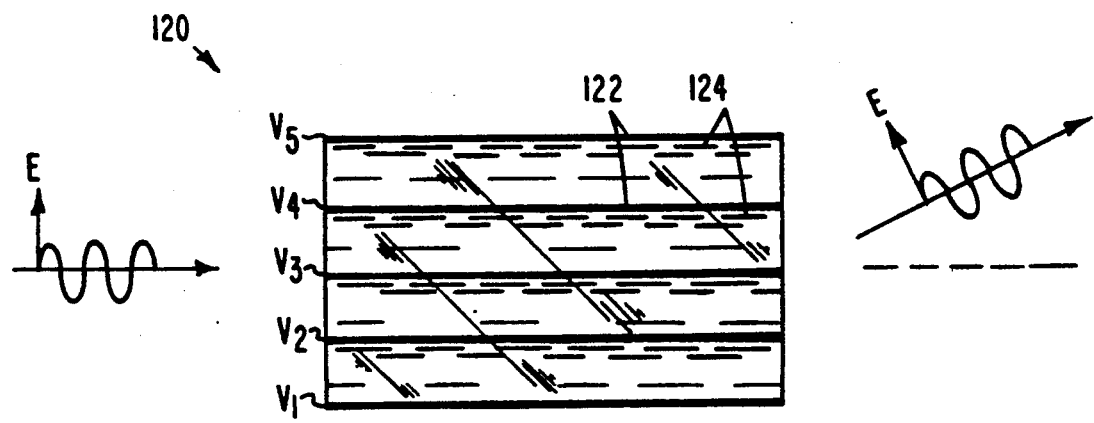
FIG. 13 is a side schematic view of a liquid crystal microwave spatial phase modulator that is used for beam steering.

A two-dimensional microwave beam steering spatial phase modulator 120 can be constructed based upon the external electric field modulation of the effective microwave refractive index of the birefringent liquid crystals. A series of parallel thin metal electrode plates 122 are stacked with narrow spacings between them. The spacings are filled with a liquid crystal media 124, as in FIG. 13. By activating the electrodes with predetermined electrode potentials $V_1, V_2, V_3, V_4, V_5$, the wave front of a microwave propagating in the plane of the electrodes 122 can be reshaped and hence the microwave beam direction changed. The P-field vector of the microwave should be perpendicular to the plane of the electrodes. In order to take advantage of the surface alignment effect of the liquid crystal, the spacing between the electrodes 122 should be on the order of 100 micrometers or less. In this configuration, the angular deflection of the beam is proportional to the applied field strength.

Figure 14:
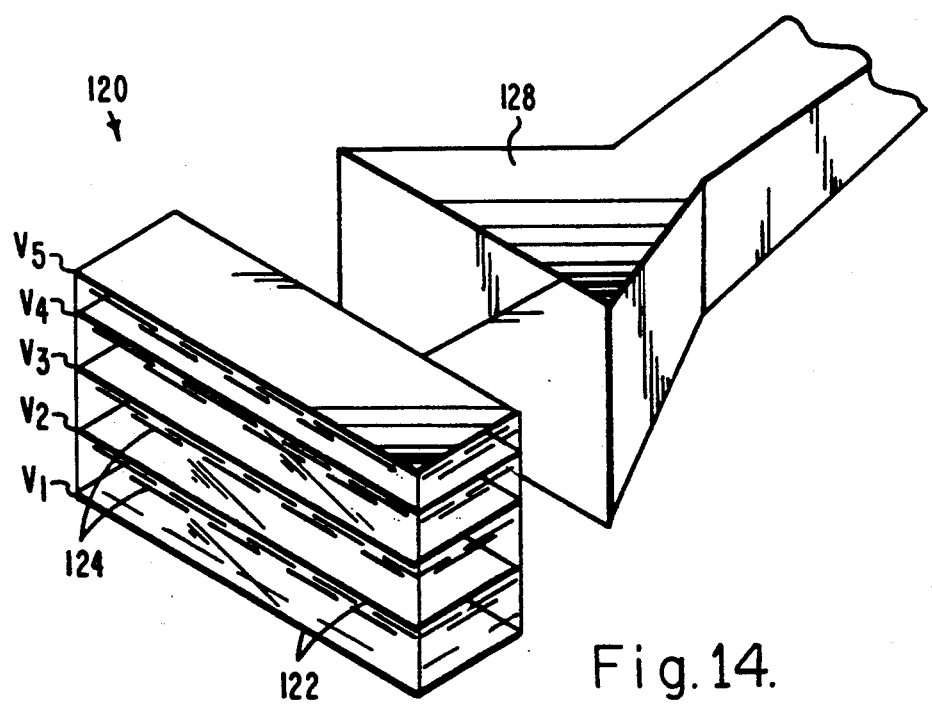
FIG. 14 is a schematic perspective view of a phase modulator used with a horn antenna.

The microwave beam modulator 120 is typically used to steer a beam radiated from a horn or any other radiating antenna. FIG. 14 shows an example of its application for a horn antenna 128. The modulator 120 is placed in front or inside the flare of the horn of the antenna 128, with the plane of the electrodes 122 perpendicular to the electric field vector of the radiating beam. On activating the electrodes 122, the radiating beam will be deflected in the plane that contains the electric field vector.

The present invention thus provides an important advance in the art of microwave (here including millimeter wave) devices. A liquid crystal microwave phase modulating medium is inexpensive to fabricate and operate, requires low power to operate, is stable against phenomena such as phase separation, and may be used in a variety of single-cell applications and multi-cell arrays. Although particular embodiments of the invention have been described in detail for purposes of illustration, various modifications may be made without departing from the spirit and scope of the invention. Accordingly, the invention is not to be limited except as by the appended claims.

What is claimed is:

1. A method for modulating a phase of a microwave, comprising the steps of:
    providing a microwave phase modulating cell comprising
        a phase modulating medium comprising an anisotropic liquid crystal, and
        means for controlling an alignment of the liquid crystal in the phase modulating medium, the means for controlling including means for applying a magnetic field for to the liquid crystal;
    directing a beam of microwave energy through the cell in a microwave wave path propagation direction; and
    applying the magnetic field to the liquid crystal to change an effective microwave index of refraction of the phase modulating medium.

2. The method of claim 1, wherein the step of applying causes the liquid crystal to align perpendicular to the microwave wave path propagation direction.

3. The method of claim 1, wherein the step of appyling causes the liquid crystal to align in a plane parallel to the microwave wave path propagation direction.

4. The method of claim 1, wherein the means for controlling includes means for applying an electric field to the liquid crystal, and in the step of applying the electric field is applied simultaneously with the magnetic field.

5. The method of claim 1, wherein the means for controlling includes means for applying an electric field to the liquid crystal, and in the step of applying the magnetic field and the electric field are applied in an alternating fashion.

6. The method of claim 1, wherein
    the phase modulating cell further comprises means for causing the liquid crystal to have preferred off-state alignment patterns to which the liquid crystal returns in the absence of applied fields.

7. A microwave phase modulating cell, comprising:
    a microwave guide;
    a phase modulating medium disposed within the wave guide, the phase modulating medium consisting of an anisotropic liquid crystal; and
    means for controlling an alignment of the liquid crystal molecules in the phase modulating medium, the means for controlling including means for applying a magnetic field to the liquid crystal.

8. The cell of claim 7, wherein the means for controlling the alignment further includes means for applying an electric field to the liquid crystal, so that the magnetic field and electric field are applied simultaneously or in an alternating fashion.

9. The cell of claim 7, wherein the means for controlling the alignment includes a pair of oppositely disposed magnetic pole pieces.

10. The cell of claim 7, wherein the phase modulating medium is a polymer dispersed liquid crystal.

11. The cell of claim 7, wherein the cell further includes
    means for inducing preferred off-state alignment patterns in the liquid crystal.

12. The cell of claim 7, wherein the liquid crystal is selected from the group consisting of a nematic, a cholesteric, and a smectic liquid crystal.

13. The cell of claim 7, wherein the liquid crystal is selected from the group consisting of a positive, a negative, and a crossover dielectric anisotropy liquid crystal.

14. The cell of claim 7, wherein the liquid crystal has a highly conjugated, rod-like molecular structure.

15. The cell of claim 7, wherein the liquid crystal has a structure including at least one group selected from the group consisting of biphenyl, terphenyl, phenylpyrimidine, biphenylpyrimidine, tolane, and diphenyldiacetylene groups.

16. The cell of claim 7, wherein the liquid crystal has a structure selected from the group consisting of Schiff bases, azoxybenzenes, and aromatic esters.

17. The cell of claim 7, wherein the phase modulating medium is interspersed with a polymer.

18. The cell of claim 7, wherein the microwave wave guide is dimensioned for a microwave having a frequency of from about 1 to about 100 GHz.

19. A microwave phase modulating cell, comprising:
a microwave wave guide;
a phase modulating medium disposed within the wave guide, the phase modulating medium consisting of an anisotropic liquid crystal; and
means for controlling an alignment of the liquid crystal molecules in the phase modulating medium, the means for controlling the alignment including a plurality of parallel electric field plates with liquid crystal material disposed between the plates for increasing electric field strength and reducing liquid crystal response time.

20. A microwave phase modulating cell, comprising:
a microwave wave guide;
a phase modulating medium disposed within the wave guide, the phase modulating medium consisting of an anisotropic liquid crystal held by a porous medium for increasing surfaces which are in contact with the liquid crystal to thereby decrease liquid crystal relaxation times; and
means for controlling an alignment of the liquid crystal molecules in the phase modulating medium.

21. A tunable slot array microwave antenna, comprising:
a microwave wave guide having slot openings located transverse to a microwave wave path propagation direction;
a phase modulating medium disposed within the wave guide, the phase modulating medium consisting of an anisotropic liquid crystal; and
means for controlling an alignment of the liquid crystal molecules in the phase modulating medium.

22. The antenna of claim 21, wherein the means for controlling includes a pair of oppositely disposed electrodes within the interior of the waveguide.

23. The antenna of claim 21, wherein the means for controlling includes means for applying a magnetic field to the phase modulating medium.

24. The antenna of claim 21, further including a microwave-transparent window overlying at least some of the openings.

25. The antenna of claim 21, wherein the liquid crystal is present in an encapsulated form.